United States Patent [19]

Yamada et al.

[11] Patent Number: 4,557,792

[45] Date of Patent: Dec. 10, 1985

[54] HOT PRESS

[75] Inventors: Osamu Yamada; Hideyasu Murooka, both of Yokohama; Kaoru Ono, Hadano; Akimi Miyashita, Toride, all of Japan

[73] Assignee: Hitachi, Ltd., Tokyo, Japan

[21] Appl. No.: 600,956

[22] Filed: Apr. 16, 1984

[30] Foreign Application Priority Data

Apr. 15, 1983 [JP] Japan .................................. 58-65574

[51] Int. Cl.⁴ .............................................. B30B 15/34
[52] U.S. Cl. ................................ 156/583.1; 100/93 P; 100/258 A; 100/270; 100/918; 156/583.91
[58] Field of Search ............. 156/583.1, 583.3, 583.91, 156/580; 100/93 P, 211, 258 A, 269 A, 270, 918, 269 R

[56] References Cited

U.S. PATENT DOCUMENTS 3,914,975 10/1975 Kawano ......................... 100/258 A
4,113,909 9/1978 Beasley ............................... 100/918
4,423,674 1/1984 Thies ............................... 156/583.1

*Primary Examiner*—Michael Wityshyn
*Attorney, Agent, or Firm*—Antonelli, Terry & Wands

[57] ABSTRACT

A hot press capable of minimizing a displacement of one substrate from another in multilayer printed circuit boards each constituted by a plurality of substrates having wiring pattern groups printed thereon which are pressed together by applying pressure into a multilayer printed circuit board. The end is attained by minimizing a variation in thickness from a central portion of the board to a peripheral portion thereof. The hot press includes plate thickness adjusting devices each interposed between each bolster and each heat insulating member to compress and deform the heat insulating members beforehand. By imparting a deformation beforehand to each heat insulating member, contacting surfaces of the heat insulating members become substantially planer when they are compressed as pressure is applied to the substrates to press them together into a multilayer printed circuit board, thereby minimizing the variation in thickness from one portion to another in the multilayer printed circuit board produced by the hot press.

6 Claims, 3 Drawing Figures

HOT PRESS

BACKGROUND OF THE INVENTION

(1) Field of the Invention

This invention relates to a hot press suitable for use in producing a multilayer printed circuit board by alternately arranging a plurality of substrates and prepregs in superposed relation and applying pressure thereto while heating them.

(2) Description of the Prior Art

Some printed circuit boards (hereinafter simply boards) have very complex wiring patterns and some have wiring patterns of very high density because of the need to meet the requirements of providing patterns of complex wiring connections having fixed components. Thus, some of them are impossible to produce as a single board. In this case, it is usual practice to split the wiring pattern into a plurality of groups and print the wiring pattern groups on respective substrates. Then the substrates are superposed one over another in a predetermined order and pressed together, before the wiring pattern groups are electrically connected together, to provide a single board which is usually referred to as a multilayer printed circuit board (hereinafter multilayer board). To produce a multilayer board, substrates each having one of the wiring pattern groups printed thereon are pressed together by means of a hot press.

A hot press comprises a pair of bolsters or an upper bolster and a lower bolster, a pair of heating plates located in a space defined between opposing surfaces of the upper and lower bolsters and each disposed adjacent one of the opposing surfaces of the bolsters through a heat insulating member interposed therebetween, and a plurality of passages each formed in one of the heating plates for supplying steam thereto for heating purposes and a plurality of passages each formed in one of the heating plates for supplying water thereto for cooling purposes.

Substrates and prepregs are alternately arranged between the heating plates in superposed relation and held between them, and pressure is applied thereto while they are heated.

The hot press of the aforesaid construction suffers the disadvantage that even if the heating plates are provided with opposing surfaces which are parallel to each other, the multilayer board produced tends to have a thickness which is greater in the central portion than in the peripheral portion.

Tests were conducted by alternately arranging five substrates [each having the dimensions of 500 mm × 500 mm × 0.2 mm (thickness) and formed of glass fiber reinforced epoxy resin] and eight prepregs [each having the dimensions of 500 mm × 500 mm × 0.1 mm (thickness)] in superposed relation with two prepregs being interposed between the two substrates or in four positions in the assembly of substrates and prepregs which were held between the heating plates heated to a predetermined temperature and pressed together with a pressure reaching a maximum of about 45 tons, to provide a multilayer board. A test showed that the thickness of the multilayer board was 1.78 mm (maximum) in the central portion and 1.6 mm (minimum) in the peripheral portion, indicating that the single multilayer board has a difference of 0.18 mm between the maximum and minimum values of its thickness. This difference will hereinafter be referred to as a variation in thickness.

There is a correlation between the variation in thickness from one portion of the multilayer board to another and the magnitude of a difference between the positions of the substrates which constitute the multilayer board (which will hereinafter be referred to as a displacement of one layer from another). Thus, the smaller the variation in thickness, the smaller becomes the displacement of one layer from another. Consequently, it is desired that the variation in the thickness of a multilayer board be minimized.

To meet the requirement of minimizing the variation in thickness, one would conceive of constructing the heating plates of the hot press in such a manner that the space defined between their opposing surfaces has a smaller distance between central portions of the opposing surfaces than between peripheral portions of the opposing surfaces.

However, when the heating plates of this construction were used, it would be necessary to alter the shape and configuration of the heating plates (the size of a protuberance in the central portion as compared with the flatness of the peripheral portion, for example) depending on the size, thickness and number of the substrates and prepregs constituting the multilayer board. This would make it necessary to have on hand different types of heating plates matching the types of the multilayer board. Thus, when the multilayer boards to be produced are of many different types but the number of each type produced is small, production and management of the heating plates would be time-consuming and causes an increase in cost. In addition, a large space would be required for storing them for use when necessary.

SUMMARY OF THE INVENTION

(1) Object of the Invention

This invention has an its object the provision of a hot press capable of minimizing a displacement of one layer from another which might otherwise be caused to occur in a multilayer board by a variation in the thickness from one portion to another in the multilayer boards by readily accommodating a change in the size, thickness and number of the substrates and prepregs constituting each multilayer board.

(2) Statement of the Invention

To accomplish the aforesaid object, the invention provides plate thickness adjusting means between each bolster for supporting each heating plate of the hot press and each heat insulating member, so as to control the size of a protuberance in the central portion of each opposing surface of the heating plate with respect to the flatness of the peripheral portion thereof.

DESCRIPTION OF THE PREFERRED EMBODIMENT

A preferred embodiment of the invention will now be described by referring to the accompanying drawings.

Figure 1:
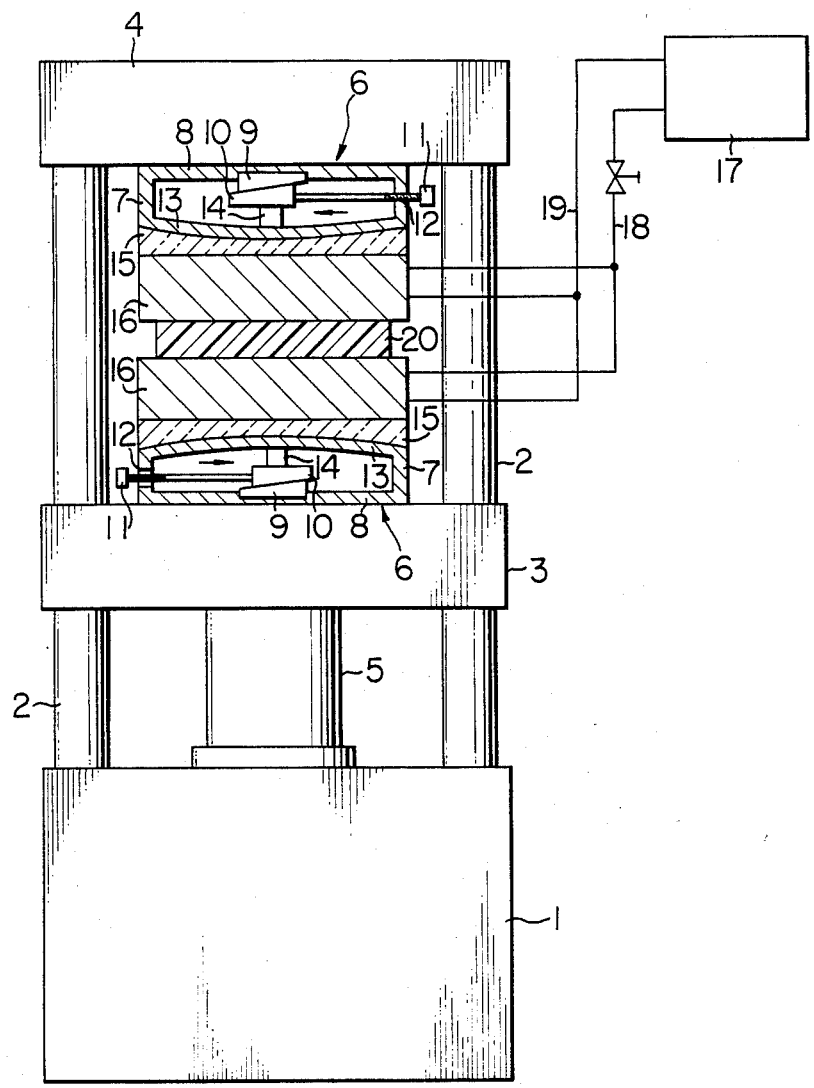
FIG. 1 is a front view of the hot press according to the invention cut away to show its essential portions.

The hot press shown in FIG. 1 comprises a base housing 1 including four guide posts 2 located in an upright position for supporting a lower bolster 3 for sliding movement and having an upper bolster 4 secured to their upper ends. The lower bolster 3 is connected to a rod of a hydraulic cylinder 5 arranged inside the base housing 1 to move the lower bolster 3 in sliding vertical reprocatory movement. The bolsters 3 and 4 have surfaces opposing each other and having plate thickness adjusting means 6 attached thereto. The plate thickness adjusting means 6 attached to the lower and upper bolsters 3 and 4 are of the same construction, so that the plate thickness adjusting means 6 of the lower bolster 3 will be described and the description of the plate thickness adjusting means 6 of the upper bolster 4 will be omitted by using like reference characters for designating similar parts.

The plate thickness adjusting means 6 comprises a housing 7 secured to the lower bolster 3 and including a bottom plate 8 having a wedge 9 secured to its inner surface. Another wedge 10 in sliding contact with the wedge 9 is connected to one end of an adjusting screw 11 threadably engaged in a threaded opening 12 formed in a side wall of the housing 7. The housing 7 also includes a top plate 13 having a push rod 14 secured to its inner surface and extending vertically into the interior of the housing 7 into sliding contact with a top surface of the wedge 10. Thus, by turning the adjusting screw 11 to move the wedge 10 in the direction of an arrow in FIG. 1, the wedge 10 can be made to move the push rod 14 upwardly. The push rod 14 pushes the top plate 13 of the housing 7 upwardly to cause the latter to be deformed from a planar shape to a spherical shape. The magnitude of deformation of the top plate 13 can be arbitrarily set at any value as desired by adjusting the turning of the adjusting screw 11. By turning the adjusting screw 11 to move the wedge 10 in a direction opposite the direction indicated by the arrow, it is possible to reduce the magnitude of deformation of the top plate 13 of the housing 7 as it pushes the push rod 14 by its resilience. The top plate 13 of the housing 7 of each plate thickness adjusting means 6 has a heat insulating member 15 in contact with its outer surface, and a heating plate 16 is in contact with the heat insulating member 15 at a surface thereof opposite its surface at which it is in contact with the top plate 13, so that the heating plates 16 face each other and define a space between their opposing surfaces. Each heating plate 16 is formed therein with a passage, not shown, for passing steam for heating purposes and a passage, not shown, for passing water for cooling purposes. The passages for the steam and water and connected to a steam and water supply source 17 through lines 18 and 19 respectively. When a multilayer board 20 is placed in the space defined between the two heating plates 16 and pressed by the heating plates 16, the steam is supplied to the heating plates 16. When the pressing of the multilayer board 20 is finished, the water is supplied to the heating plates 16.

In the hot press of the aforesaid construction, the magnitude of deformation of the top plate 13 of the housing 7 of each plate thickness adjusting means 6 is obtained beforehand by experiments in a manner to conform with the specifications (the material, size, thickness and number of times of use of the substrates and prepregs constituting the multilayer board 20). Then, based on the specifications of the multilayer boards 20 to be produced, the adjusting screw 11 of the plate thickness adjusting means 6 is turned to set the deformation of the top plate 13 of the housing 7 at a predetermined value by moving the wedge 10.

Then, the substrates and prepregs are alternately superposed one over another based on the specifications of the multilayer board 20 and placed on the heating plate 16 associated with the lower bolster 16. At this time, the steam is supplied to each heating plate 16 to heat same. Then, the hydraulic cylinder 5 is actuated to move the lower bolster 3 upwardly. This moves the substrates and prepregs placed on the heating plate 16 associated with the lower bolster 3 into contact with the heating plate 16 associated with the upper bolster 4, so that the substrates and prepregs are held between the two heating plates 16. As the lower bolster 3 is further forced upwardly by the hydraulic cylinder 5, the substrates and prepregs are pressed against each other while being heated, so that they are pressed together into intimate contact with each other to provide the desired multilayer board 20. After a predetermined time has elapsed following the commencement of the application of pressure, the supply of the steam to the heating plates 16 is terminated and the supply of water is commenced to cool the multilayer board 20 by cooling the heating plates 16. Then, the hydraulic cylinder 5 is actuated to move the lower bolster 3 downwardly, to remove the multilayer board 20 from the hot press.

The pressure applied to the multilayer board 20 to press the substrates and prepregs together into intimate contact with each other is transmitted from the lower and upper bolsters 3 and 4 via the plate thickness adjusting means 6, heat insulating members 15 and heating plates 16. A reaction to the pressure applied to the multilayer board 20 in this fashion is transmitted from the multilayer board 20 to the heating plates 16. As a result, the heat insulating members 15 formed of a material of lower Young's modulus than the materials used for forming the heating plates 16 and plate thickness adjusting means 6 are deformed by compression. However, since the central portions of the heat insulating members 15 are compressed beforehand by the deformation of the plate thickness adjusting means 6, the surface of each heat insulating member 15 in contact with the respective heating plate 16 becomes substantially flat. Therefore, the heating plates 16 also become substantially flat, thereby making it possible to achieve the desired minimization of the variation in thickness from one portion to another in the multilayer board 20.

As one example, experiments were carried out by using a hot press of the following specifications:

| | |
|---|---|
| Guide posts 2 | 100 mm in diameter. |
| Lower and upper bolsters 3 and 4 | 150 mm in thickness and 1000 mm in length and width. |
| Housing 7 of plate thickness adjusting means 6 | 70 mm in height and 800 mm in width and length. |
| Top plates 13 of housings 7 | 5 mm in thickness. |
| Push rods 14 of plate thickness adjusting means 6 | 50 mm in diameter. |
| Heat insulating members 15 | formed of asbestos, 50 mm in thickness and 800 mm in width and length. |
| Heating plates 16 | 50 mm in thickness |

-continued

| |
|---|
| and 800 mm in width and length. |

In the hot press of the aforesaid specifications, five substrates formed of glass fiber reinforced epoxy resin [500 mm×500 mm×0.2 mm (thickness)] and eight prepregs [500 mm×500 mm×0.1 mm (thickness)] were alternately arranged one over another in superposed relation with two prepregs being interposed between the two substrates or in four positions in the assembly of substrates and prepregs and pressed together into intimate contact with each other by applying a pressure reaching about 45 tons at a maximum. At this time, the top plates 13 of the plate thickness adjusting means 6 had their opposing surfaces shaped spherically in such a manner that their central portions protruded about 0.4 mm from the peripheral portions.

The multilayer boards 20 produced by applying pressure in the assemblies of substrates and prepregs as described hereinabove were 1.79 mm (maximum) in the central portion and 1.76 mm (minimum) in the peripheral portion in thickness, with a variation in thickness from one portion to another being 0.03 mm.

The variation in thickness of the above-mentioned value obtained in the multilayer boards produced by the hot press according to the invention is 1/6 that obtained in the multilayer boards of the prior art, indicating that the invention is capable of achieving an improvement in dimensional accuracy with respect to plate thickness. Thus, the invention makes it possible to reduce the displacement of one layer from another in the multilayer boards 20 below 1/6 that in the multilayer boards of the prior art.

Figure 2:
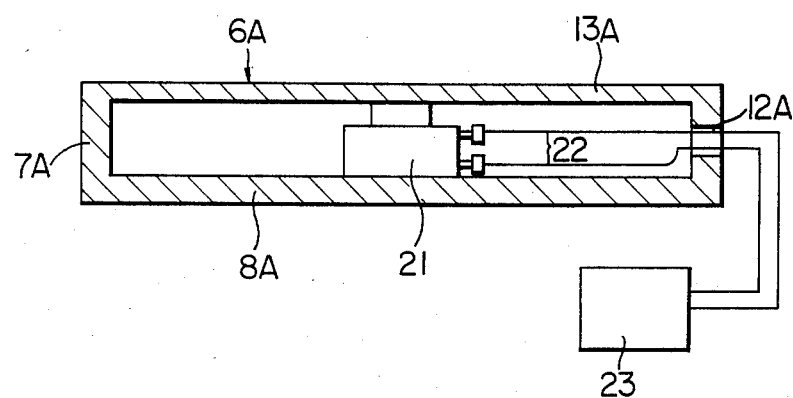
FIG. 2 is a sectional front view of a modification of the plate thickness adjusting means shown in FIG. 1.

FIG. 2 shows a modification of the plate thickness adjusting means 6 shown in FIG. 1. In this modification, the wedges 9 and 10, push rods 14 and adjusting screws 11 are replaced by hydraulic cylinders.

More specifically, in FIG. 2, plate thickness adjusting means 6A comprises a hydraulic cylinder 21 in the housing 7A between the bottom plate 8A and top plate 13A. The hydraulic cylinder 21 receives a supply of pressurized fluid from a pressurized fluid supply source 23 through a line 22 connected thereto and extending through an aperture 12A formed in a side wall of the housing 7A.

In the constructional form shown in FIG. 2, the relation between the pressure of the fluid supplied from the pressurized fluid supply source 23 to the hydraulic cylinder 21 and the specifications of the multilayer boards to be produced is obtained beforehand by experiments. Then, the pressure of the fluid to be supplied from the pressurized fluid supply source 23 to the hydraulic cylinder 21 is set in conformity with the specifications of the multilayer boards to be produced. By applying pressure to an assembly of substrates and prepregs in the same manner as described by referring to FIG. 1, it is possible to produce multilayer boards in which a variation in thickness from one portion to another in the multilayer boards 20 is minimized.

In this constructional form, it is possible to readily set an optimum operating condition merely by setting the pressure of the pressurized fluid supplied from the pressurized fluid supply source 23 to the hydraulic cylinder 21 of the plate thickness adjusting means 6A. In the plate thickness adjusting means 6A shown in FIG. 2, the hydraulic cylinder 21 may be removed and pressurized fluid may be supplied directly into the interior of the hollow housing 7A to obtain deformation of the top plate 13A. This makes it possible to simplify the construction of the plate thickness adjusting means 6A.

Figure 3:
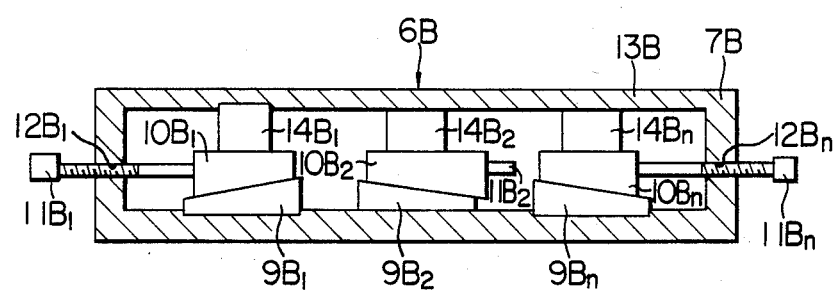
FIG. 3 is a sectional front view of still another modification of the plate thickness adjusting means shown in FIG. 1.

FIG. 3 shows another modification of the plate thickness adjusting means 6 shown in FIG. 1. In this constructional form, wedges $9B_1$ to $9B_n$ and $10B_1$ to $10B_n$ and push rods $14B_1$ to $14B_n$ corresponding to the wedges 9 and 10 and push rod 14 respectively are arranged in predetermined positions in the housing 7B. Adjusting screws $11B_1$ to $11B_n$ threadably engaged in the threaded openings $12B_1$ to $12B_n$ formed in the side wall of the housing 7B are connected to the wedges $10B_1$ to $10B_n$ respectively.

This constructional form enables the shape of the top plate 13B of the plate thickness adjusting means 6B to serve the purpose of minimizing a variation in thickness from one portion to another in the multilayer boards with a gretaer success. This is conductive to a further reduction in the variation in thickness.

What is claimed is:

1. A hot press comprising:
   a pair of bolsters comprising an upper bolster and a lower bolster;
   a pair of heating plates located in a space defined between opposing surfaces of the upper bolster and the lower bolster and each being maintained in contact with the opposing surface of the respective bolster through a heat insulating member, so that pressure can be applied to a plurality of substrates and a plurality of prepregs arranged alternately in superposed relation and held between surfaces of the pair of heating plates opposite the surfaces thereof adjacent the heat insulating members while heating them to provide a multilayer printed circuit board; and
   plate thickness adjusting means interposed between one of the bolsters and the heat insulating member associated therewith to compress the heat insulating member, comprising a hollow housing including a top plate and a bottom plate, a hydraulic cylinder connected to the top plate and the bottom plate of the housing, and a pressurized fluid supply source connected to said hydraulic cylinder to supply a pressurized fluid thereto.

2. A hot press as claimed in claim 1, wherein a plurality of hydraulic cylinders are located in the housing in place of one hydraulic cylinder.

3. A hot press comprising:
   a pair of bolsters comprising an upper bolster and a lower bolster;
   a pair of heating plates located in a space defined between opposing surfaces of the upper bolster and the lower bolster and each being maintained in contact with the opposing surface of the respective bolster through a heat insulating member, so that pressure can be applied to a plurality of substrates and a plurality of prepregs arranged alternately in superposed relation and held between surfaces of the pair of heating plates opposite the surfaces thereof adjacent the heat insulating members while heating them to provide a multilayer printed circuit board; and
   plate thickness adjusting means interposed between one of the bolsters and the heat insulating member associated therewith to compress the heat insulating member, comprising a hollow housing including a top plate and a bottom plate, a wedge secured to the bottom plate, a push rod secured to the top plate located in face-to-face relation to the wedge, another wedge slidably arranged between said first mentioned wedge and push rod, and a moving mechanism for moving the last mentioned wedge.

4. A hot press as claimed in claim 3, wherein said moving mechanism comprises a hydraulic cylinder connected between an end face of said last mentioned wedge and a side plate of said housing, and a pressurized fluid supply source is provided to supply a pressurized fluid to said hydraulic cylinder.

5. A hot press as claimed in claim 3, wherein said moving mechanism comprises an adjusting screw including a threaded portion for threadably engaged in a threaded opening formed in a side wall of said housing and connected at one end to an end face of the last mentioned wedge.

6. A hot press as claimed in claim 3, wherein the wedge secured to the bottom plate, the push rod secured to the top plate, another wedge slidably arranged between the first mentioned wedge and push rod and the moving mechanism for moving the last mentioned wedge are all plural in number, and the plurality of wedges secured to the bottom plate are spaced apart from each other a predetermined distance, each of said plurality of push rods is positioned against one of said plurality of first mentioned wedges, each of said last mentioned wedges is located for sliding movement between one of said plurality of first mentioned wedges and one of said plurality of push rods, and the plurality of moving mechanisms are each associated with one of said plurality of last mentioned wedges to move same.

* * * * *